(12) United States Patent
Del Gatto et al.

(10) Patent No.: US 7,750,656 B2
(45) Date of Patent: Jul. 6, 2010

(54) CIRCUIT FOR DISTRIBUTING A TEST SIGNAL APPLIED TO A PAD OF AN ELECTRONIC DEVICE

(75) Inventors: Nicola Del Gatto, Torre del Greco (IT); Antonio Geraci, Monza (IT); Marco Sforzin, Monza (IT); Nicola Rosito, Milan (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 137 days.

(21) Appl. No.: 11/349,596

(22) Filed: Feb. 8, 2006

(65) Prior Publication Data

US 2006/0195735 A1    Aug. 31, 2006

(30) Foreign Application Priority Data

Feb. 8, 2005    (IT)    ............ VA2005A0007

(51) Int. Cl.
*G01R 31/02*    (2006.01)
(52) U.S. Cl. ............................ 324/763; 324/765
(58) Field of Classification Search ........... 324/763, 324/765, 158.1; 714/733–734, 724; 438/14–17; 257/48
See application file for complete search history.

(56) References Cited

U.S. PATENT DOCUMENTS

| | | | | |
|---|---|---|---|---|
| 4,707,654 A * | 11/1987 | Suzuki et al. | ............... | 324/763 |
| 4,827,437 A * | 5/1989 | Blanton | ............... | 702/89 |
| 5,311,122 A * | 5/1994 | Fullerton et al. | ............... | 324/158.1 |
| 5,796,266 A * | 8/1998 | Wright et al. | ............... | 324/763 |
| 6,356,095 B1 * | 3/2002 | Komoriya | ............... | 324/763 |
| 6,356,096 B2 * | 3/2002 | Takagi et al. | ............... | 324/765 |
| 6,433,628 B1 * | 8/2002 | Morris | ............... | 327/565 |
| 6,734,693 B2 * | 5/2004 | Nakayama | ............... | 324/763 |
| 6,812,727 B2 * | 11/2004 | Kobayashi | ............... | 324/765 |
| 6,825,683 B1 * | 11/2004 | Berndt et al. | ............... | 324/763 |
| 6,847,203 B1 * | 1/2005 | Conti et al. | ............... | 324/158.1 |
| 7,190,593 B2 * | 3/2007 | Aiki et al. | ............... | 361/767 |
| 7,202,688 B2 * | 4/2007 | Choi | ............... | 324/763 |
| 2005/0046473 A1 * | 3/2005 | Furue | ............... | 327/565 |

* cited by examiner

*Primary Examiner*—Ha Tran T Nguyen
*Assistant Examiner*—Arleen M Vazquez
(74) *Attorney, Agent, or Firm*—Lisa K. Jorgenson; Allen, Dyer, Doppelt, Milbrath & Gilchrist, P.A.

(57) ABSTRACT

The circuit distributes a test signal applied to a pad of an electronic device that is enabled during test phases of the device and disabled during normal functioning. The circuit includes a "master" buffer, one or more "slave" buffers, one for each replicated pad, and an interconnection bus of the "master" and "slave" buffers. During a test phase, the "master" buffer replicates on the interconnection bus the test signal fed to a pad of the device, while the "slave" buffers convey to the various replica pads of the feed pad the signal present on the interconnection bus. During the normal operation of the device, the circuit remains disabled.

15 Claims, 3 Drawing Sheets

CIRCUIT FOR DISTRIBUTING A TEST SIGNAL APPLIED TO A PAD OF AN ELECTRONIC DEVICE

FIELD OF THE INVENTION

The present invention relates to the field of integrated circuits, and more particularly to techniques for testing electronic devices.

BACKGROUND OF THE INVENTION

Demand for electronic devices capable of implementing ever more numerous functions has led toward chips with an ever increasing number of connection pins. As a consequence, the time required for testing monolithically fabricated devices on a silicon wafer has increased proportionally with the number of pins of each device. Typically, there may be about 500 memory chips realized on a single 8-inch wafer and it is evident that verifying one memory chip at the time would require too much time.

For this reason, techniques have been devised for parallel testing the individual chips on the wafer. In practice, test devices having a plurality of conducting probes are used. The tips of the probes are in contact with different pads of a plurality of devices realized on wafer, and through them the test system may simultaneously feed test signals to a plurality of devices and verify that their responses satisfy the specifications.

In case of devices with numerous contacting pads, it may become impossible to carry out tests on wafer of many chips in parallel because these test systems have a limited number of probes. It is thus important to limit the number of pads of integrated devices. The so-called LPC (Low Pin Count) devices satisfy this requisite because though their input and output pads signals are transferred in serial mode signals. In practice, through input/output pads of an LPC device commands and information may be exchanged with the external world. Packaged LPC memory devices may have up to 80 pins or more and the chip may have only about 15 pads. With LPC electronic devices it is possible to remarkably reduce the number of probes necessary for testing on wafer the functioning of each device and thus the number of devices that may be tested at the same time.

Generally, electronic devices have at least an array of input pads and an array of output pads. Often, because of design constraints, it is necessary to replicate in each of these arrays of pads a certain number of pads having the same function. For instance, it may happen that circuits physically integrated distant one from the other must be input with a same external signal (for instance a clock signal). In theory, it would be possible to feed this signal only on one pad of the device and then distribute it to different circuits through an internal line, but this would slow down the functioning of the device and could generate synchronization problems because of propagation delays along the internal line.

To achieve maximum speed of the device, replica pads are realized for providing a same external signal physically close to the respective circuits that use it. FIG. 1 shows by way of example this situation in which the clock pad CLK has been replicated in each of the four arrays or groups of pads of the chip. These replica pads are realized on respective connection balls of the package through a bonding operation. Commonly, they are connected to an input buffer of the device IN_BUFFER through a protection block ESD PROT against accidental electrostatic discharges.

During test operations, each of these replicated pads must be contacted by a respective probe. Understandably, the more numerous the replicated pads are, the fewer are the chips that may be tested at the same time by the test system. It would be desirable that the number of probes necessary to test an electronic device were independent from the number of replicated pads of the devices.

SUMMARY OF THE INVENTION

Studies carried out for overcoming this drawback confirmed that by internally connecting together replicated pads having the same function would cause unacceptable propagation delays during the normal operation of the device, but that could be tolerable during a test phase. Indeed, these propagation delays are relatively short compared to the time generally required for testing electronic devices.

Therefore, differently from what is commonly accepted by skilled persons, it is convenient to internally short-circuit replicated pads, provided that short-circuiting electrical paths be eventually opened after testing such that normal functioning of the finished device will not suffer intolerable propagation delays of the signals.

An effective circuit is provided for distributing a test signal applied to a pad of an electronic device that is enabled during test phases of the device and disabled during normal functioning. The circuit of this invention includes a "master" buffer, one or several "slave" buffers, one for each replicated pad, and an interconnection bus of the "master" and "slave" buffers.

During a test phase, the "master" buffer replicates on the interconnection bus the test signal fed to a pad of the device, while the "slave" buffers convey to the various replica pads of the feed pad the signal present on the interconnection bus. During the normal functioning of the device, the circuit remains disabled.

Preferably, the circuit of this invention is integrated within each electronic device.

BRIEF DESCRIPTION OF THE DRAWINGS

The invention will be described referring to the attached drawings, wherein.

DETAILED DESCRIPTION OF THE PREFERRED EMBODIMENTS

Figure 1:
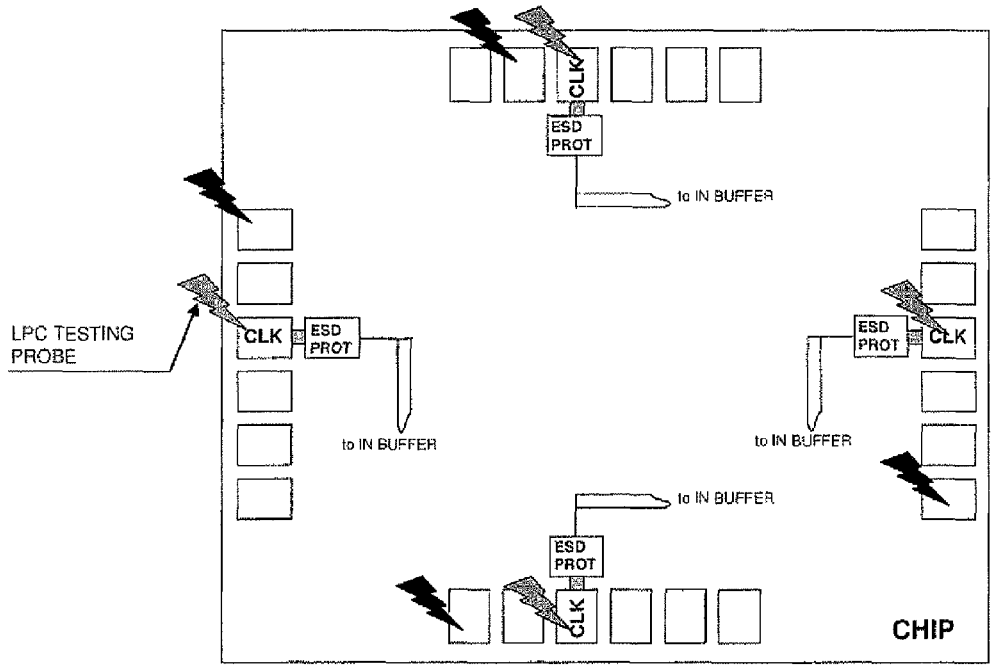
FIG. 1 is a schematic diagram showing a chip with CLK pads replicated in each of the four groups of pads according to the prior art.
Figure 2:
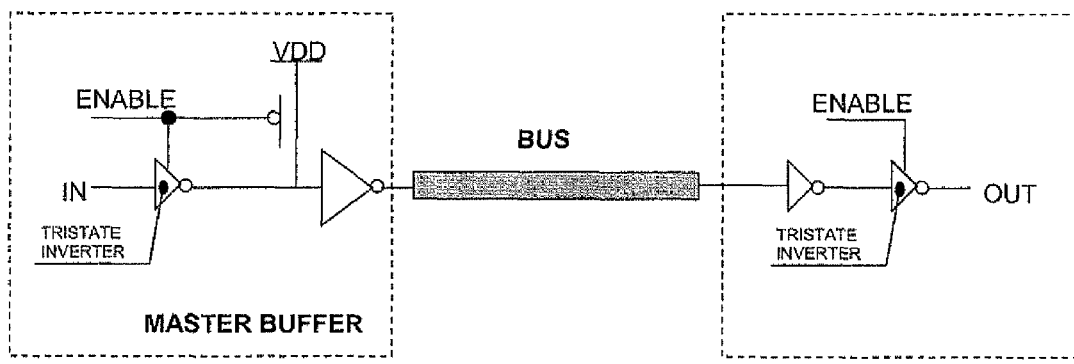
FIG. 2 is a schematic diagram showing a circuit, that may be integrated on the chip, for distributing a test signal among replicated pads, according to this invention.

A test signal distribution circuit of this invention is shown in FIG. 2. It includes a "master" buffer and of one or more "slave" buffers connected to the "master" buffer via an interconnection bus. A test signal is fed on an input IN of the "master" buffer by applying it to a pad contacted by the tip of a probe during a test on wafer phase, and the master buffer transfers it on the interconnection bus when the master buffer is enabled by the enabling signal ENABLE.

The distribution circuit has as many "slave" buffers as the replicated pads of the "first" pad. Each of these "slave" buffers, enabled by the same signal ENABLE, makes the signal present on the interconnection bus available at the output OUT. The signal distribution circuit of this invention is connected to the pads of the device to be tested such that the input of the "master" buffer is connected to the "first" pad, while the output of each "slave" buffer replicates the signal present on the interconnection bus on a respective replicated pad.

Figure 3:
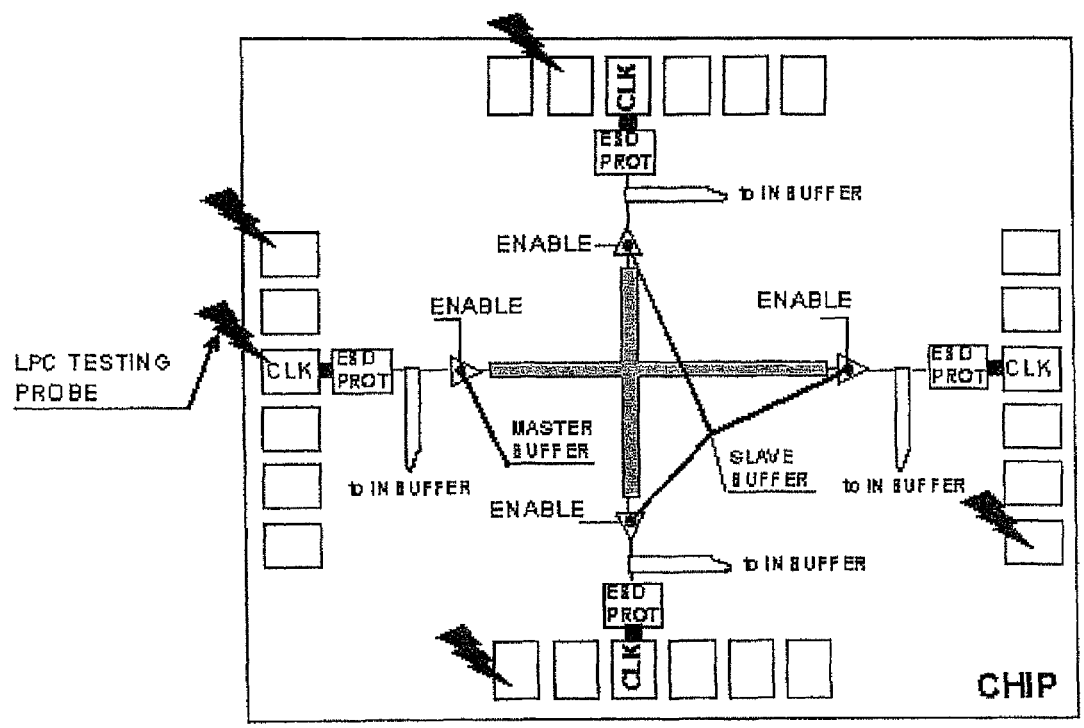
FIG. 3 is a schematic diagram showing a chip with replica pads interconnected by the distribution circuit of FIG. 2 integrated on chip.

Preferably, the distribution circuit of this invention is integrated within each electronic device, as shown in FIG. 3. Once the test operations are finished, the need to connect homologous pads together ceases because they will be used independently from one another during normal functioning of the integrated device.

Therefore, the signal ENABLE is disabled by setting in tristate the buffers "master" and "slave", and by grounding the interconnection bus. Preferably, the enabling signal ENABLE is internally generated when an external command is provided. Alternatively, in a device that includes configuration means for an LPC functioning mode of the device enabled by imposing a voltage VDD on a certain EWS pad of the device, as shown in FIG. 2, the signal ENABLE may be a replica of the signal present on such an EWS pad. Preferably, the distribution circuit is coupled to respective pads through any commonly used protection networks ESD PROT for protecting the circuit connected to an external pin of the packaged device from electrostatic discharges, as shown in FIG. 3.

Figure 4:
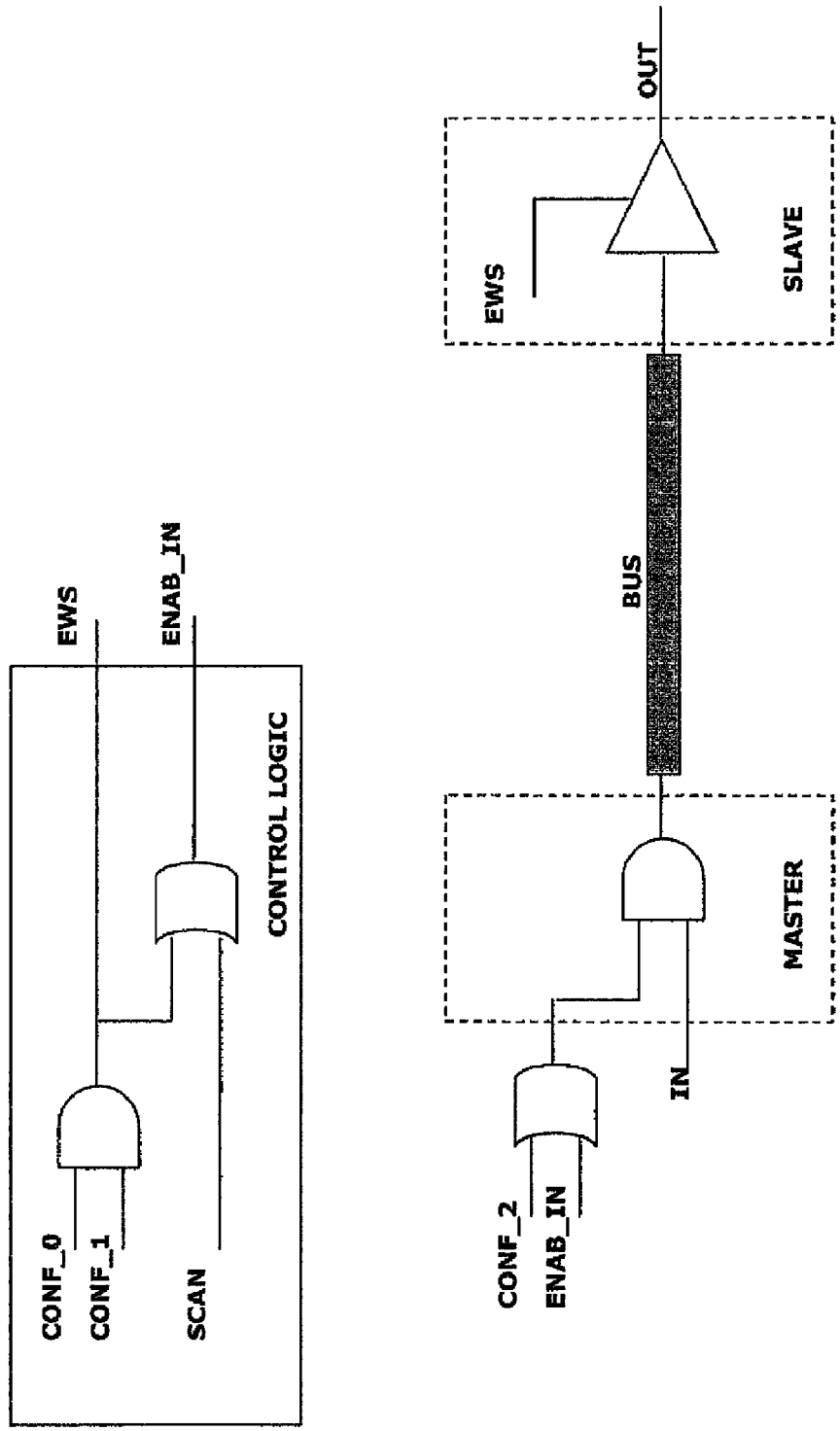
FIG. 4 is a schematic diagram showing a control circuit for in the access to a bus of distinct master buffers, according to an embodiment of the invention.

If in the integrated device there are more than a group of replicated pads carrying out the same function, it is also possible to integrate a distinct distribution circuit for each group. Each of these distribution circuits may have its own interconnection bus or, according to an alternative embodiment not shown in the figures, they may access in turn to a single bus. In the latter case, it will be necessary to also integrate in the device a control circuit, as shown in FIG. 4, for managing the access to the bus of distinct "master" buffers.

The invention claimed is:

1. A distribution circuit for distributing a test signal applied on a first pad of a single integrated circuit, comprising a semiconductor substrate and circuitry thereon, to a plurality of replica pads of the first pad during a test of the single integrated circuit, comprising:
   a master buffer on the single integrated circuit having an input and an output, the input being coupled to the first pad and said master buffer configured to generate a replica of the test signal on the output;
   an electrically parallel interconnection bus on the single integrated circuit coupled to the output of said master buffer; and
   a slave buffer on the single integrated circuit for each replica pad, and having an input and an output, the input being coupled to said electrically parallel interconnection bus for receiving the replica of the test signal, each slave buffer replicating the test signal on the output coupled to a respective replica pad;
   said electrically parallel interconnection bus electrically coupling the output of said master buffer to each slave buffer in parallel.

2. The distribution circuit according to claim 1, wherein the distribution circuit is integrated within the single integrated circuit.

3. The distribution circuit according to claim 1, wherein master and slave buffers are controlled by an enabling signal.

4. A single integrated circuit comprising:
   a semiconductor substrate and circuitry thereon, said circuitry comprising
   a first pad,
   a plurality of replica pads of the first pad, and
   at least one distribution circuit for distributing a test signal applied on the first pad to the replica pads of the first pad during a test of the single integrated circuit, and comprising
      a master buffer having an input and an output, the input being coupled to the first pad and said master buffer configured to generate a replica of the test signal on the output,
      an electrically parallel interconnection bus coupled to the output of said master buffer, and
      a slave buffer for each of the replica pads, and having an input and an output, the input being coupled to said electrically parallel interconnection bus for receiving the replica of the test signal, each slave buffer replicating the test signal on the output coupled to a respective replica pad,
      said electrically parallel interconnection bus electrically coupling the output of said master buffer to each slave buffer in parallel.

5. The single integrated circuit according to claim 4, wherein said circuitry further comprises:
   an input buffer; and
   a protection circuit, to protect the single integrated circuit from electrostatic discharges, and coupling each pad to the input buffer, the protection circuit also coupling the input of said master buffer to the first pad, and coupling the output of each slave buffer to the respective replica pad.

6. The single integrated circuit according to claim 4, wherein the test signal is applied to the first pad via a contact probe.

7. The single integrated circuit according to claim 4, wherein said circuitry further comprises a control circuit that generates an enabling signal for said master and slave buffers when the single integrated circuit is set in a test mode.

8. The single integrated circuit according to claim 7, wherein the at least one distribution circuit comprises a plurality of distribution circuits including a common interconnection bus and being controlled by respective enabling signals; and wherein said control circuit manages the common interconnection bus via the enabling signals.

9. The single integrated circuit according to claim 4, wherein said circuitry further comprises a mode selection pad for setting the single integrated circuit in a Low Pin Count (LPC) operation mode; and wherein said mode selection pad receives an enabling signal for said master and slave buffers.

10. A method of making a single integrated circuit, comprising a semiconductor substrate and circuitry thereon, and including a first pad and a plurality of replica pads of the first pad, the method comprising:
   integrating at least one distribution circuit within the single integrated circuit to distribute a test signal applied on the first pad to the replica pads of the first pad during a test of the single integrated circuit, and comprising
   coupling an input of a master buffer to the first pad and generating a replica of the test signal on an output of the master buffer,
   coupling an electrically parallel interconnection bus to the output of the master buffer, and
   coupling an input of a slave buffer for each of the replica pads to the electrically parallel interconnection bus for receiving the replica of the test signal, and for replicating the test signal on an output of each slave buffer to a respective replica pad,
   the electrically parallel interconnection bus electrically coupling the output of the master buffer to each slave buffer in parallel.

11. The method according to claim 10, wherein the single integrated circuit further comprises an input buffer, and a protection circuit, to protect the integrated circuit device from electrostatic discharges and coupling each pad to the input buffer, the method further comprising:

coupling the input of the master buffer to the first pad via the protection circuit; and coupling the output of each slave buffer to the respective replica pad via the protection circuit.

12. The method according to claim 10, further comprising applying the test signal to the first pad via a contact probe.

13. The method according to claim 10, further comprising generating an enabling signal via a control circuit for the master and slave buffers when the single integrated circuit is set in a test mode.

14. The method according to claim 13, wherein integrating the at least one distribution circuit comprises integrating a plurality of distribution circuits including a common interconnection bus and being controlled by respective enabling signals.

15. The method according to claim 10, wherein the single integrated circuit further includes a mode selection pad for setting the single integrated circuit in a Low Pin Count (LPC) operation mode, the method further comprising providing an enabling signal for the master and slave buffers on the mode selection pad.

\* \* \* \* \*